United States Patent [19]

Chung

[11] Patent Number: 4,932,030
[45] Date of Patent: Jun. 5, 1990

[54] FREQUENCY STABILIZATION OF LONG WAVELENGTH SEMICONDUCTOR LASER VIA OPTOGALVANIC EFFECT

[75] Inventor: Yun C. Chung, Aberdeen, N.J.

[73] Assignee: AT&T Bell Laboratories, Murray Hill, N.J.

[21] Appl. No.: 361,472

[22] Filed: Jun. 5, 1989

[51] Int. Cl.⁵ ............................................... H01S 3/13
[52] U.S. Cl. ........................................ 372/32; 372/96
[58] Field of Search ............................ 372/32, 96, 108

[56] References Cited

U.S. PATENT DOCUMENTS

| | | | |
|---|---|---|---|
| 3,842,367 | 10/1974 | Schlossberg | 372/32 |
| 4,385,388 | 5/1983 | Engelking | 372/32 |
| 4,434,490 | 2/1984 | Kavaya et al. | 372/32 |
| 4,509,132 | 4/1985 | Kavaya | 372/32 |
| 4,660,206 | 4/1987 | Halmos et al. | 372/32 |
| 4,700,150 | 10/1987 | Hall et al. | 372/32 |
| 4,745,606 | 5/1988 | Uehara et al. | 372/32 |

OTHER PUBLICATIONS

Yamaguchi et al., "Simultaneous Stabilization . . . ", IEEE J. of Quantum Elec.; vol. QE-19; No. 10, pp. 1514-1519; Oct., 1983.
Green et al., Appl. Phys. Lett., vol. 29, No. 11, pp. 727-729, 1976, "Galvanic Detection of Optical Absorptions . . . ".
Green et al., IEEE J. of Quant. Elect., QE-13, No. 2, 1977, "Use of an Opto-Galvanic Effect to Frequency-Lock . . . ", pp. 63-64.
Yamaguchi et al., Appl. Phys. Lett., 41(7), 1982, "Frequency Stabilization of a Diode Laser . . . ", pp. 597-598.
Yamaguchi et al., Appl. Phys. Lett., 41(11), 1982, "Frequency Locking of an InGaAsP Semiconductor . . . ", pp. 1034-1036.
Nielsen et al., J. Opt. Commun., 4(1983)4, pp. 122-125, "Frequency Stabilization of Singlemode Semiconductor . . . ".
Yanagawa et al., Appl. Phys. Lett., 47(10), 1985, pp. 1036-1038, "Frequency Stabilization of an InGaAsP Distributed Feedback . . . ".
Chung et al., Elect. Lett., vol. 23, No. 20, 1987, pp. 1044-1045, "450 Hz Relative Frequency Stability in an AlGaAs Diode Laser".
Koizumi et al., Elec. Lett. Vol. 24, No. 1, 1988, pp. 13-14, "Frequency Stabilisation of Semiconductor Laser Using Atomic . . . ".

Primary Examiner—William L. Sikes
Assistant Examiner—Robert E. Wise
Attorney, Agent, or Firm—Gregory C. Ranieri

[57] ABSTRACT

Frequency stabilization of a long wavelength semiconductor laser is achieved by employing the optogalvanic effect in a feedback control loop with the laser. Absolute references are obtained using noble gases such as argon (1.2 $\mu$m to 1.4 $\mu$m) and krypton (1.4 $\mu$m to 1.6 $\mu$m). Standard detection, feedback control and dithering lock-in techniques are used to insure proper frequency stabilization.

5 Claims, 5 Drawing Sheets

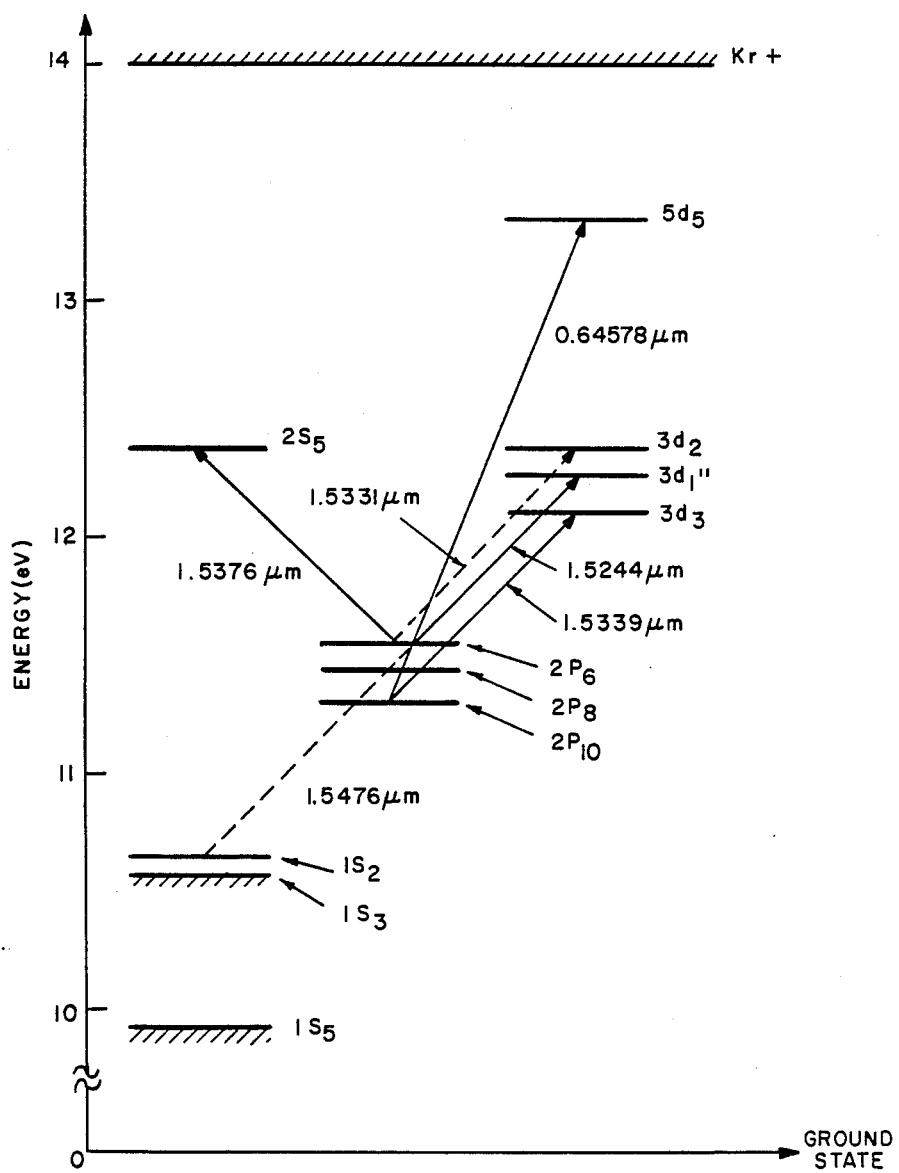

FREQUENCY STABILIZATION OF LONG WAVELENGTH SEMICONDUCTOR LASER VIA OPTOGALVANIC EFFECT

TECHNICAL FIELD

This invention relates to optical sources and, more particularly, to wavelength or frequency stabilization techniques for such sources.

BACKGROUND OF THE INVENTION

Coherent communication systems are being designed in the long wavelength regime 1.2 $\mu$m to 1.6 $\mu$m using Group III-V semiconductor lasers to take advantage of optical fiber loss minima. In these applications, it is necessary to maintain reasonably close tolerances on wavelength (frequency) stability of the optical sources. Unfortunately, semiconductor lasers exhibit sufficiently large frequency drifts due to junction temperature and injection current variations to obstruct their use as transmitter sources, receiver local oscillators, or system references or reference clocks in such systems without the addition of complicated compensation or tracking control loops.

It is understood that because of their well understood mathematical relationship, the terms "wavelength" and "frequency" are used interchangeably herein without loss of generality.

Frequency stabilization techniques for semiconductor lasers have been widely discussed in the technical literature since the early part of the present decade. While the scope of techniques discussed is quite broad to include the use of Fabry-Perot interferometers and atomic or molecular transition lines as references, most reports are limited to the short wavelength region involving AlGaAs lasers which operate around 0.8 $\mu$m. See, for example, C. J. Nielsen et al., *J. Opt. Commun.*, Vol. 4, pp. 122-5 (1983) dealing with the use of Fabry-Perot interferometers; S. Yamaguchi et al., *IEEE J. Quantum Electron.* Vol. QE-19, pp. 1514-9 (1983) on the use of atomic transition lines; and H. Tsuchida et al., *Jpn. J. Appl. Phys.*, Vol. 21, pp. L1-L3 (1982) on the use of molecular transition lines.

Fabry-Perot interferometric techniques are vulnerable to long term drifts caused by fluctuations of the resonant cavity. Longer term stability is afforded by using atomic or molecular transition lines. Of the latter two approaches, atomic transition lines are preferred over molecular transition lines. Atomic spectra offer relatively few, widely separated and, therefore, easily identifiable strong lines. On the other hand, molecular transition line spectra are complex and weak which, in turn, results in the need for very long absorption cells as a reference.

Only a few articles have reported experiments for laser frequency stabilization on longer wavelength semiconductor lasers operating above 1.2 $\mu$m. Such sources are usually based on Group III-V materials such as InGaAsP/InP. The reported experiments solely employ molecular transition lines as references. In one experiment, absorption lines of the ammonia ($NH_3$) molecule are used to frequency stabilize an InGaAsP distributed feedback laser. See, T. Yanagawa et al., *Appl. Phys. Lett.*, Vol. 47, pp. 1036-8 (1985). Another experiment employed first overtone vibration-rotation lines of hydrogen fluoride (HF) molecules to frequency lock an InGaAsP laser. See, S. Yamaguchi et al., *Appl. Phys. Lett.*, Vol. 41, pp. 1034-6 (1982). One other experiment utilized absorption lines of water vapor ($H_2O$) molecules and ammonia molecules in spectral measurements for pollutant gas monitoring. See M. Ohtsu et al., *Jpn. J. Appl. Phys.*, Vol. 22, pp. 1553-7 (1983).

It is noteworthy that experiments reported in the long wavelength region are restricted to using only molecular transition lines. In part or in whole, this is apparently due to the fact that there has been much reported difficulty, and there have been no reported successes, in finding useful atomic transitions in this wavelength region emanating from the ground state. But, a careful review of the literature shows that one need not be restricted to only those frequency stabilization techniques which employ atomic transitions from the ground state. It is well known to use optogalvanic signals corresponding to transitions from excited atomic states for stabilizing short wavelength AlGaAs semiconductor lasers. See, for example, S. Yamaguchi et al., *IEEE J. Quantum Electron.*, Vol. QE-19, 1514-9 (1983) describing the optogalvanic effect of krypton.

Unfortunately, extension of the optogalvanic effect to frequency stabilization techniques for longer wavelength semiconductor lasers was cast in serious doubt in 1982 when the recognized experts in the field stated that output power from longer wavelength semiconductor lasers (InGaAsP/InP) is insufficient to produce an impedance change in the discharge tube. Since the optogalvanic effect concerns large impedance changes of the gas discharges by optical (laser) irradiation at wavelengths corresponding to non-ionizing transitions of species present in the discharge, the experts deduced that the optogalvanic signals would be difficult, at best, to detect for the longer wavelength lasers. See, S. Yamaguchi et al., *Appl. Phys. Lett.*, Vol. 41, pp. 1034 (1982). It is reasonable to surmise that the failure to have published works over the last score on the extension of the optogalvanic signal techniques for frequency stabilization developed and improved by Yamaguchi et al. at short wavelengths is, in large part, due to the chilling effect on other researchers of the experts' own published statement which knowingly predicts failure of the technique at longer wavelengths.

SUMMARY OF THE INVENTION

Frequency stabilization of a long wavelength semiconductor laser is achieved by employing feedback control of the laser with the optogalvanic effect. Absolute references are obtained using noble gases such as argon (1.2 $\mu$m to 1.4 $\mu$m) and krypton (1.4 $\mu$m to 1.6 $\mu$m). Standard detection, feedback control and dithering lock-in techniques are used to insure proper frequency stabilization.

BRIEF DESCRIPTION OF THE DRAWING

A more complete understanding of the invention may be obtained by reading the following description of specific illustrative embodiments of the invention in conjunction with the appended drawing in which:

FIGS. 4 and 5 show partial energy diagrams for argon and krypton, respectively.

DETAILED DESCRIPTION

Figure 1:
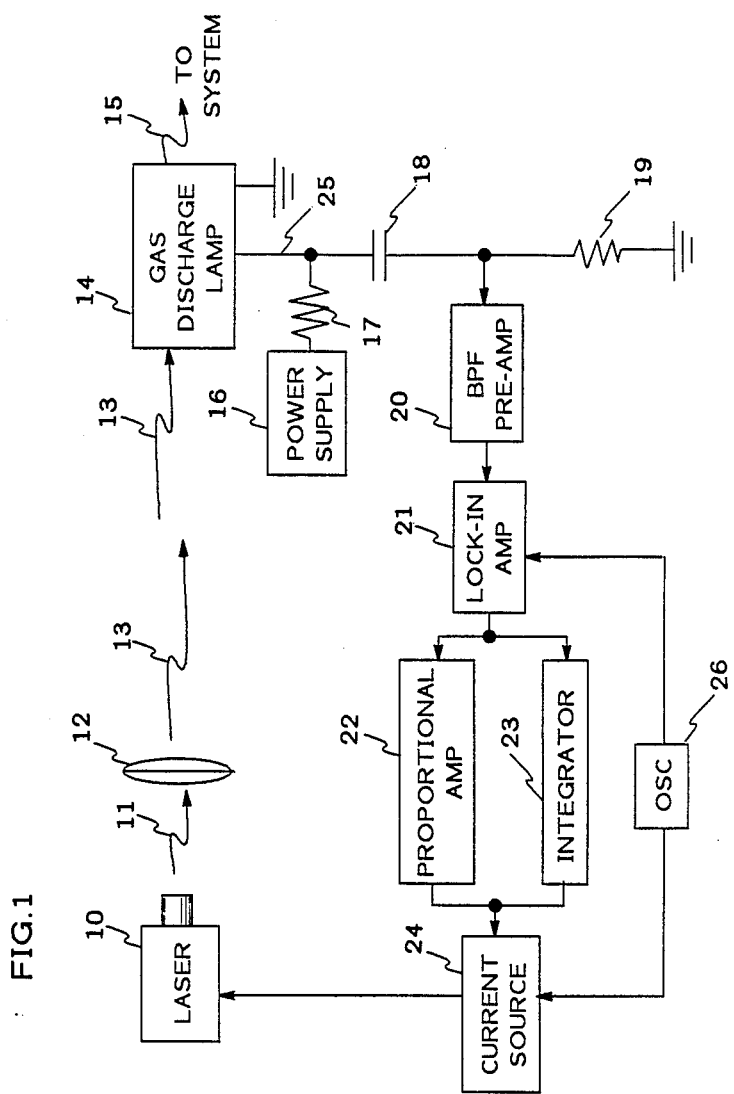
FIG. 1 shows a block diagram of an exemplary frequency stabilization arrangement for a long wavelength semiconductor laser in accordance with the principles of the invention.

FIG. 1 shows a block diagram of an embodiment of a frequency stabilization arrangement for a long wavelength semiconductor laser. The term, "long wavelength semiconductor laser", is intended to include those semiconductor lasers operating in a wavelength region above 1.2 µm. In this wavelength region, group III-V semiconductor materials derived from InGaAsP compositions are suitable for fabricating long wavelength lasers as defined herein.

As shown in FIG. 1, laser 10 generates optical signal 11 which is focused by lens 12 onto gas discharge lamp 14. Optical signal 13 is incident on gas discharge lamp 14 to induce the optogalvanic signal to occur on lead 25 from the gas discharge lamp. Optical signal 13 passes through the gas discharge lamp to emerge substantially undiminished as optical signal 15. After an initial stabilization period, optical signals 11, 13, and 15 are stabilized to the wavelength (frequency) of the desired atomic transition line.

The optogalvanic signal on lead 25 from gas discharge lamp 14 occurs as a result of the optogalvanic effect. As presently understood, the optogalvanic effect is observed as a change in the voltage across a low pressure gas discharge tube produced by irradiation with intense monochromatic light (laser light) tuned to a transition wavelength of the gas species present in the discharge. It should be understood by those skilled in the art that gas discharge tubes or lamps include indicator lamps and hollow cathode lamps.

Power supply 16 limited through ballast resistor 17 supplies a constant current to gas discharge lamp 14 via lead 25. The optogalvanic signal is supplied by lead 25 to the feedback control loop. This loop includes coupling capacitor 18, monitoring resistor 19, optional bandpass filter and preamplifier 20, lock-in amplifier 21, proportional amplifier 22, integrator 23, current source 24 and oscillator 26. The elements in the feedback loop are connected substantially as shown in FIG. 1. This feedback loop arrangement for controlling laser 10 is well known to those skilled in the art. See, for example, S. Yamaguchi et al. *IEEE J. Quant. Elect.*, Vol. QE-19, No. 10, p. 1514 (1983).

Output lead 25 from gas discharge lamp 14 is connected to an AC coupling capacitor 18. The output AC voltages changes are monitored by resistor 19 and are supplied to bandpass filter and preamplifier 20. Bandpass filter and preamplifier 20 is an optional element and is designed to have a narrow passband centered substantially about the oscillator frequency. The output signal from bandpass filter and preamplifier 20 is supplied to lock-in amplifier 21. Lock-in amplifier 21 is used to synchronously detect the signal generated by the gas discharge lamp. The first derivative signal caused by the frequency dithering is used as a frequency discriminator in the feedback control loop. The output from lock-in amplifier 21 is supplied along parallel paths to proportional amplifier 22 and integrator 23. The combined output signal from proportional amplifier 22 and integrator 23 is an error signal which is used to correct the bias current supplied to laser 10 by current source 24. This correction and bias current results in a correction of the nominal operating wavelength of the laser. Typically, the frequency of the laser 10 is initially adjusted by temperature (coarse adjustment) or by injection current (fine adjustment) or by a combination of temperature and injection current to have a nominal operating wavelength within at least one GHz of the desired atomic transition line wavelength. The feedback control loop serves to bring the nominal operating wavelength of the laser into substantial coincidence with the desired atomic transition line wavelength.

Oscillator 25 is connected to both lock-in amplifier 21 and current source 24. Oscillator 25 provides a low frequency dither signal to laser 10 and to the feedback control loop for establishing source modulation to detect the optogalvanic signal. The low frequency dither signal is generally on the order of several kHz.

Figure 2:
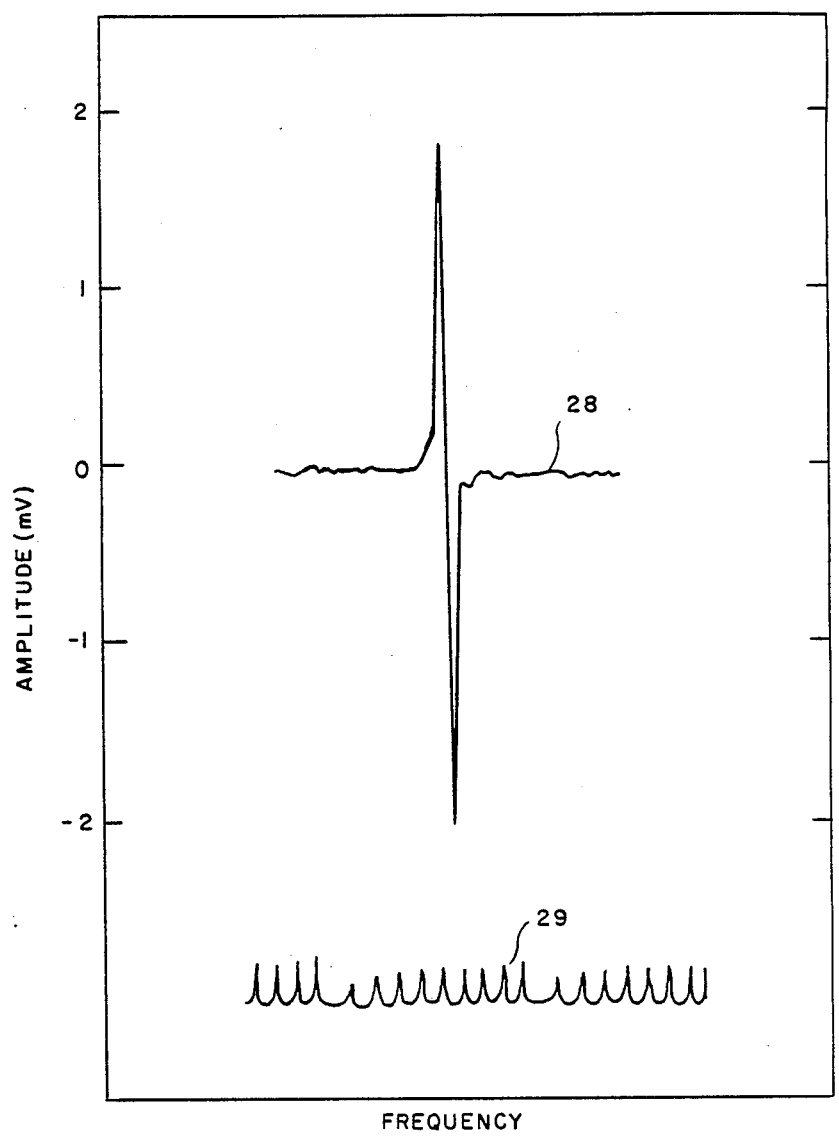
FIG. 2 shows an exemplary first derivative signal of an atomic transition obtained from a gas discharge lamp utilized in the arrangement from FIG. 1.

FIG. 2 shows an exemplary first derivative signal 28 measured by lock-in amplifier 21. Signal 28 is the first derivative signal of Kr $2p_{10}$-$3d_3$ transition (1.5339 µm). The lower trace shown in FIG. 2 as signal 29 is a sequence of frequency markers of interference fringes for a confocal Fabry-Perot interferometer having a free spectral range of 750 MHz. The markers permit measurement of the peak-to-peak width of the first derivative signal which, in this case, is approximately 380 MHz at a slope of approximately 10µV/MHz near the atomic transition line wavelength.

Figure 3:
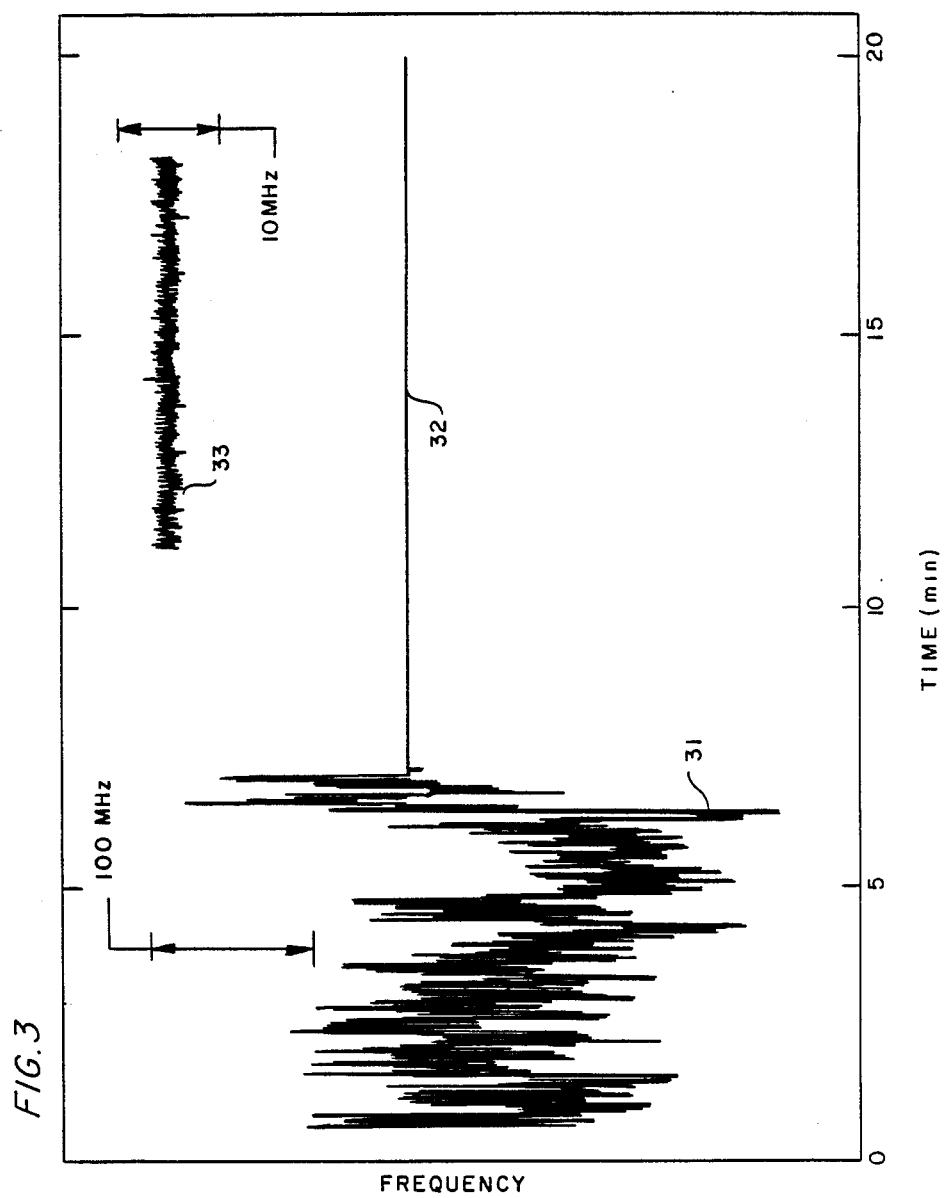
FIG. 3 shows an error signal trace with the laser free-running and frequency stabilized.

FIG. 3 depicts an error signal trace with laser 10 initially in a free running mode (open loop) and finally in a frequency stabilized mode (closed loop). This trace was actually measured using a hollow cathode lamp exhibiting the Kr $2p_{10}$-$3d_3$ transition (1.5339 µm). Free running operation is indicated by curve 31 wherein peak-to-peak frequency fluctuations exceeded 500 MHz. Curve 32 and curve 33 (a 10x magnification of curve 32) show that frequency fluctuations during frequency stabilized operation were substantially reduced to a few MHz.

It has been found by me experimentally that long wavelength semiconductor lasers can be frequency stabilized by using optogalvanic signals from gas discharge lamp containing a noble gas species. The optogalvanic signals are input to a standard feedback control loop or servo loop to bring the nominal operating wavelength of the laser into substantial coincidence with the desired atomic transition line wavelength for the species in the gas discharge lamp. In most cases, it is necessary only to adjust the bias current to the long wavelength semiconductor laser to achieve frequency locking. Although it has not been shown, it may also be desirable to adjust the operating temperature of the laser in order to achieve large scale frequency corrections and, thereby, frequency locking.

In an example from experimental practice frequency locking has been achieved using an InGaAsP distributed feedback laser mounted on a thermoelectrically cooled copper heat sink. The temperature of the heat sink was regulated to within 0.1° C. The frequency tunability of the laser was 1.8 GHz/ma and 14.2 GHz/°C. The nominal operating wavelength of the laser was adjusted to a region where the optogalvanic signal corresponding to the Ar $2p_{10}$-$3d_5$ transition (1.2960 µm) is expected to be observed. In order to accomplish this initial adjustment, the operating temperature and the injection current for the laser were set to 8° C. and 65 ma, respectively. Gas discharge lamp 14 was an Ar filled miniature glow lamp (General Electric AR9) having a diameter of approximately 0.6 cm and a length of approximately 2.3 cm. Normal glow discharge was maintained with a discharge current in excess of 35µa. The lamp was discharged by a 100 volt power supply dropping approximately 80 volts across the lamp. Laser power incident on the lamp was approximately 1 mW. To obtain the frequency discriminate signal at the output of lock-in amplifier 21, oscillator 26 dithers the injection current to the laser sinusoidally in small amounts (85μa) at approximately 2 kHz. Frequency stability during closed loop operation was observed at better than 13 MHz.

Figure 4:
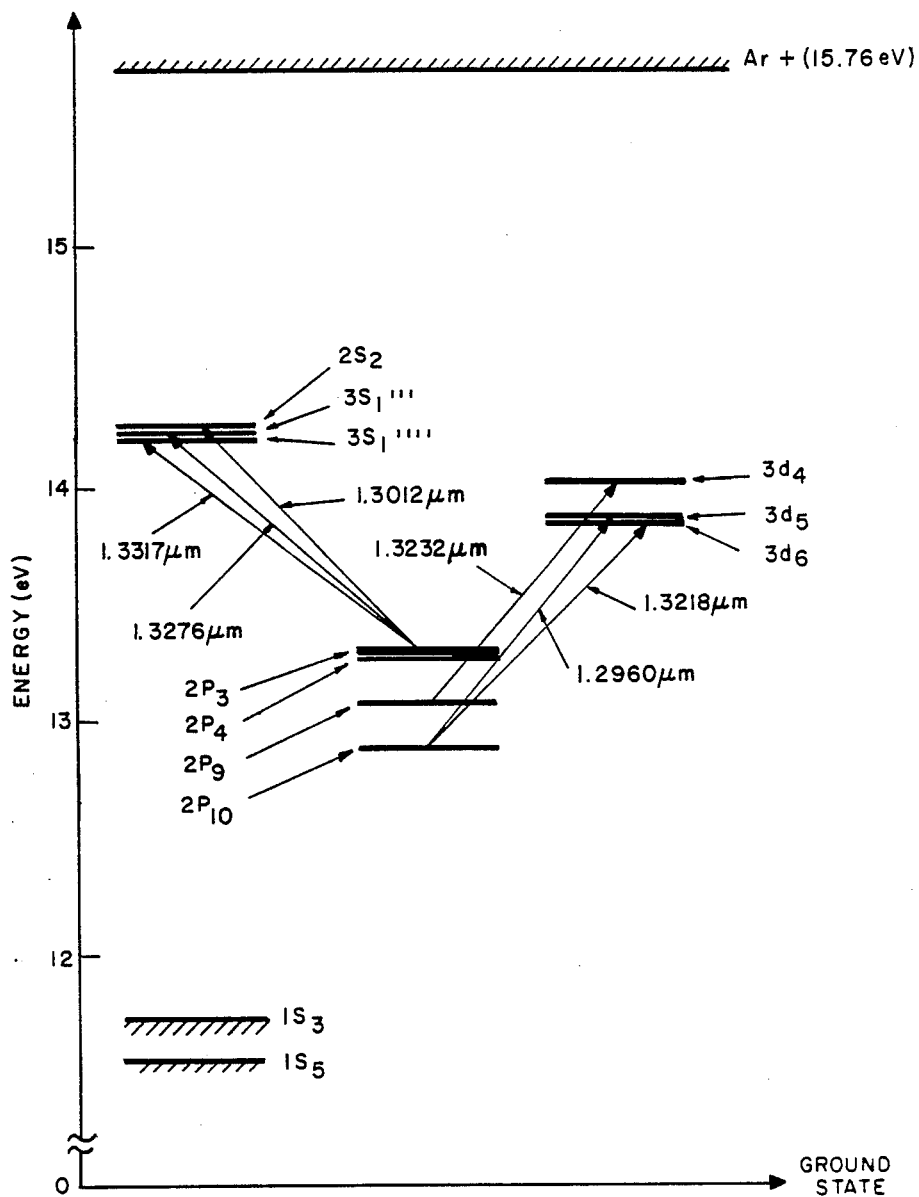

It is contemplated that long wavelength semiconductor lasers may be frequency stabilized to many atomic transitions lines for noble gasses in the long wavelength regime. FIGS. 4 and 5 show a plurality of atomic transition lines for noble gasses in the long wavelength regime. Such atomic transition lines are obtainable in gas discharge lamps which are commercially available such as the glow lamp described above, hollow cathode lamps containing krypton or other noble gasses, and the like.

FIG. 4 shows a partial energy diagram for argon. Atomic transition lines are shown with corresponding wavelengths in the 1.2 μm to 1.4 μm range for the related transition. Transitions in this wavelength range and their particular wavelengths are as follows:

| Transition | Wavelength (μm) |
|---|---|
| $2p_{10}$-$3d_5$ | 1.2960 |
| $2p_3$-$2s_2$ | 1.3011 |
| $2p_{10}$-$3d_6$ | 1.3217 |
| $2p_9$-$3d_4$ | 1.3231 |
| $2p_3$-$3s_1'$ | 1.3276 |

FIG. 5 shows a partial energy diagram for krypton. Atomic transition lines are shown with corresponding wavelengths in the 1.4 μm to 1.6 μm range for the related transition. Transitions in this wavelength range and their particular wavelengths are as follows:

| Transition | Wavelength (μm) |
|---|---|
| $2p_8$-$3d_1$ | 1.5243 |
| $2p_{10}$-$3d_3$ | 1.5339 |
| $2p_6$-$2s_5$ | 1.5376 |

In addition to the atomic transition lines described above, it has been found that a gas discharge lamp containing the noble gas species Xenon exhibits a useful long wavelength transition at $3p_7$-$2s_4$ (1.5422 μm). Also, it has been found that argon exhibits another long wavelength transition at $2p_1$-$3s_1'$ (1.5050 μm). These transitions are useful for long wavelength laser stabilization and are not for purposes of limitation.

I claim:

1. A stabilization arrangement for a semiconductor laser comprising:
   a semiconductor laser for generating an optical signal having a nominal operating wavelength greater than 1.2 μm;
   a gas discharge element for generating an optogalvanic signal at a predetermined wavelength corresponding to an atomic transition line of gas atoms in said gas discharge element in response to said optical signal, said gas atoms selected from the group consisting of noble gases, said nominal operating wavelength being substantially close to said predetermined wavelength;
   feedback control means responsive to said optogalvanic signal for dynamically adjusting a characteristic of said semiconductor laser to stabilize said nominal operating wavelength of the semiconductor laser to be substantially equal to said predetermined wavelength.

2. The stabilization arrangement defined in claim 1 wherein said noble gas is krypton and said nominal operating wavelength is between 1.4 μm and 1.6 μm.

3. A stabilization arrangement for a semiconductor laser comprising:
   a semiconductor laser for generating an optical signal having a nominal operating wavelength between 1.2 μm and 1.4 μm;
   a gas discharge element for generating an optogalvanic signal at a predetermined wavelength corresponding to an atomic transition line of gas atoms in said gas discharge element in response to said optical signal, said gas atoms including argon, said nominal operating wavelength being substantially close to said predetermined wavelength;
   feedback control means responsive to said optogalvanic signal for dynamically adjusting a characteristic of said semiconductor laser to stabilize said nominal operating wavelength of the semiconductor laser to be substantially equal to said predetermined wavelength.

4. The stabilization arrangement as defined in claim 3 wherein said atomic transition line is selected from the group consisting of $2p_{10}$-$3d_5$, $2p_3$-$2s_2$, $2p_{10}$-$3d_6$, $2p_9$-$3d_4$, and $2p_3$-$3s_1'''$.

5. A stabilization arrangement for a semiconductor laser comprising:
   a semiconductor laser for generating an optical signal having a nominal operating wavelength between 1.4 μm and 1.6 μm;
   a gas discharge element for generating an optogalvanic signal at a predetermined wavelength corresponding to an atomic transition line of gas atoms in said gas discharge element in response to said optical signal, said gas atoms including krypton, said atomic transition line is selected from the group consisting of $2p_8$-$3d_1'''$, $2p_{10}$-$3d_3$, and $2p_6$-$2s_5$, said nominal operating wavelength being substantially close to said predetermined wavelength;
   feedback control means responsive to said optogalvanic signal for dynamically adjusting a characteristic of said semiconductor laser to stabilize said nominal operating wavelength of the semiconductor laser to be substantially equal to said predetermined wavelength.

* * * * *